(12) United States Patent
Park

(10) Patent No.: US 7,075,824 B2
(45) Date of Patent: Jul. 11, 2006

(54) NAND FLASH MEMORY DEVICE

(75) Inventor: Sung Kee Park, Kyungsangbuk-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 11/016,286

(22) Filed: Dec. 17, 2004

(65) Prior Publication Data

US 2005/0254303 A1    Nov. 17, 2005

(30) Foreign Application Priority Data

May 15, 2004    (KR) .................... 10-2004-0034518

(51) Int. Cl.
    *G11C 16/04*    (2006.01)
(52) U.S. Cl. .................... 365/185.17; 365/185.33; 365/185.18

(58) Field of Classification Search ............... None
    See application file for complete search history.

(56) References Cited

U.S. PATENT DOCUMENTS

| 6,633,057 | B1* | 10/2003 | Kawata et al. ............... 257/211 |
| 6,845,042 | B1* | 1/2005  | Ichige et al. ........... 365/185.17 |
| 6,951,790 | B1* | 10/2005 | Violette ...................... 438/257 |
| 6,958,936 | B1* | 10/2005 | Quader et al. ......... 365/185.17 |

* cited by examiner

*Primary Examiner*—David Lam
(74) *Attorney, Agent, or Firm*—Marshall, Gerstein & Borun LLP

(57) ABSTRACT

Disclosed is a NAND flash memory device which includes butting taps that are formed in such a manner that a poly layer and a silicide layer are connected to given points at the ends of a DSL and the SSL of a NAND flash memory device through a metal contact. The butting taps reduces the resistance of the DSL and the SSL and, consequently, reduce the loading time of the DSL and the SSL.

4 Claims, 5 Drawing Sheets

NAND FLASH MEMORY DEVICE

BACKGROUND

1. Technical Field

A NAND flash memory device is disclosed in which loading times of a drain select line (hereinafter, referred to as 'DSL') and a source select line (hereinafter, referred to as 'SSL') are reduced through a reduction in resistance of a DSL and a SSL of the disclosed NAND flash memory device.

2. Description of the Related Art

The operation of a memory cell of a NAND flash memory device is performed on a block basis. The operation of such a memory cell is performed with a selected block separated from a non-selected block. The DSL and SSL of a block that is selected when a memory cell operates are inputted with a bias, as shown in Table 1 below. On the contrary, the DSL and SSL of a non-selected block are grounded. In this time, as shown in FIG. 13, the DSL/SSL are located at the top and the bottom of a string, respectively, so that a string is selected. Also, the string consists of 16 or 32 memory cells that are serially connected.

TABLE 1

|  | Selected Block | Non-selected Block |
| --- | --- | --- |
| DSL | VCC (Power Supply Voltage) | GND (Ground Voltage) |
| SSL | VCC (Power Supply Voltage) | GND (Ground Voltage) |

As a NAND flash memory device operates in a serial manner, the memory cells operate sequentially on a block basis. Therefore, the DSL/SSL change from the power supply voltage to the ground voltage or from the ground voltage to the power supply voltage. The DSL/SSL structure of a NAND flash memory device, which is currently being used, is located adjacent to a X-decoder 20. Thus, there is a difference in RC delay depending upon the location of the DSL/SSL. In other words, a cell that is located at the farthest from the X-decoder 20 undergoes the worst effect compared to a cell that is located adjacent to the X-decoder 20. This is because only a first poly resistor is used and the cell is located at the farthest from a bias input unit.

SUMMARY OF THE DISCLOSURE

Accordingly, in view of the above problems, a NAND flash memory device is disclosed where the loading times of the DSL and the SSL are reduced through a reduction in the resistance of the DSL and SSL.

To achieve the reduced loading times, a NAND flash memory device is disclosed which comprises: a plurality of memory cells are serially connected to form one string; a memory cell array consisting of a plurality of the strings; a drain select line and a source select line are provided for transferring a bias received from a X-decoder to the opposite side of the X-decoder in order to select the strings; a poly layer and a silicide layer are provided for constituting the drain select line and the source select line which are electrically interconnected at given points between the X-decoder and the opposite side of the X-decoder through metal contacts, thereby forming a number of butting taps; one of the butting taps is formed at the front ends of the drain select line and the source select line which are located on the part of the X-decoder; and the other of the butting taps is formed at the ends of the drain select line and the source select line which are located on the opposite side of the X-decoder.

DETAILED DESCRIPTION OF THE PRESENTLY PREFERRED EMBODIMENTS

Figure 1:
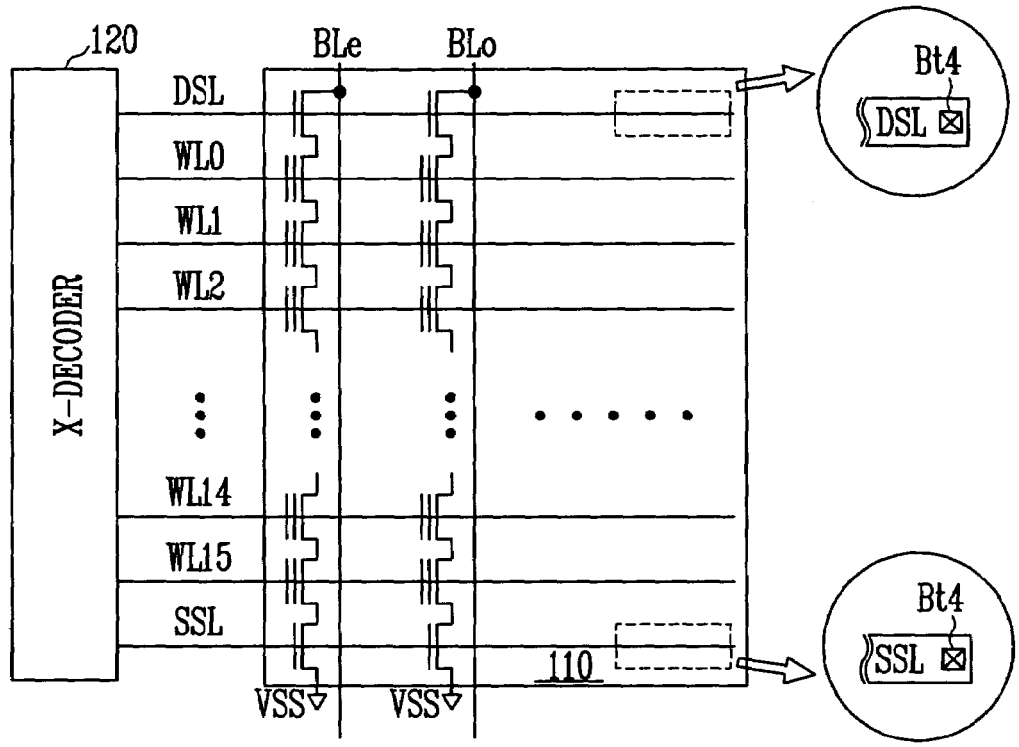
FIG. 1 is a circuit diagram showing the construction of a disclosed NAND flash memory device.
Figure 2:
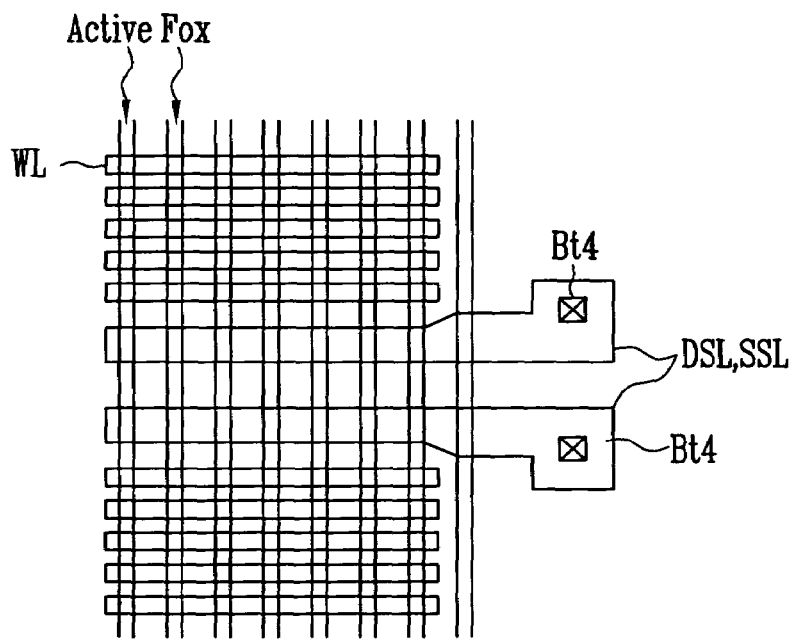
FIG. 2 is an enlarged plan view showing a portion of the dotted line in FIG. 1.
Figure 3:
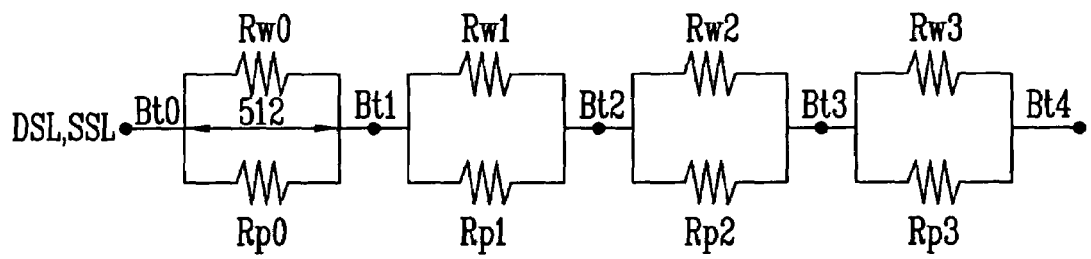
FIG. 3 is a circuit diagram of the DSL and the SSL shown in FIG. 1.
Figure 4:
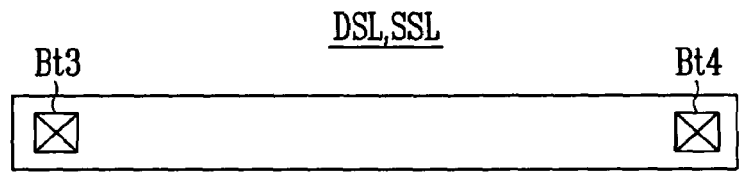
FIG. 4 is a plan view schematically showing the DSL and SSL of FIG. 2.

FIG. 1 is a circuit diagram showing the construction of a disclosed NAND flash memory device. FIG. 2 is a plan view showing an expanded portion of the dotted line of FIG. 1. FIG. 3 is an equivalent circuit diagram of the DSL and the SSL shown in FIG. 1. FIG. 4 is a plan view schematically showing the DSL and the SSL shown in FIG. 2.

Referring to FIGS. 1 to 4 and the NAND flash memory device disclosed therein, butting taps Bt0 to Bt4 are formed at given points of a DSL and SSL. The butting taps Bt0 to Bt4 are formed in such a way that a first poly layer 103 and a tungsten (W) silicide layer 106 are electrically connected through a metal layer 107, as shown in FIG. 8.

The butting taps Bt0 to Bt4 can be formed one by one every 512 cells. These butting taps Bt0 to Bt4 are formed on the opposite side as well as on the part of a X-decoder 120. As shown in FIG. 3, the butting tap Bt0 is one that is formed in the DSL and SSL which is nearest to the X-decoder 120, and the butting tap Bt4 is one that is formed at the ends of the DSL and SSL which are located farthest from the X-decoder 120. These butting taps Bt0 to Bt4 can be fabricated by the following method.

Figure 8:
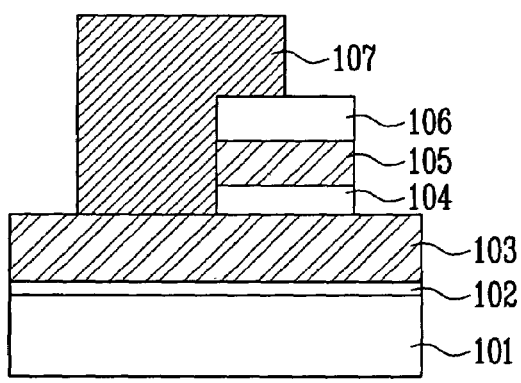
FIG. 8 is a cross-sectional view of a butting tap shown in FIG. 3.

As shown in FIG. 8, a tunnel oxide film 102, a first poly layer 103, an ONO (Oxide/Nitride/Oxide) layer 104, a second poly layer 105 and a tungsten silicide layer 106 are sequentially deposited on a semiconductor substrate 101. The tungsten silicide layer 106, the second poly layer 105 and the ONO layer 104 are etched to expose the first poly layer 103. A metal layer 107 for metal contact is then deposited on the exposed portion. The first poly layer 103 and the tungsten silicide layer 106 are electrically connected through the metal layer 107.

As described above, the butting taps Bt0 to Bt4 are formed by electrically connecting the tungsten silicide layer 106 and the first poly layer 103. It is thus possible to reduce resistance of the DSL and SSL. This will be described with reference to FIG. 3. A total resistance $R_{Bt}$ where the DSL and SSL are implemented using the butting taps Bt0 to Bt4 every 512 cell, and a total resistance R where the DSL and SSL are implemented using only the first poly layer 103, i.e., a total resistance R where the first poly layer 103 and the tungsten silicide layer 106 are not connected can be expressed into the following Equation (A).
RBt $$R = 4 \times Rp = 4 \times 512 \times 170 = 348,160 \tag{A}$$

In Equation (A), it is assumed that Rw=Rw0=Rw1=Rw2=Rw3, and Rp=Rp0=Rp1=Rp2=Rp3. Also, Rp≦170Ω and Rw≦10Ω.

From this equation, it can be seen that the total resistance of the DSL and the SSL when the butting taps Bt0 to Bt4 are formed is significantly reduced compared to that when butting taps are not used at all.

Figure 7:
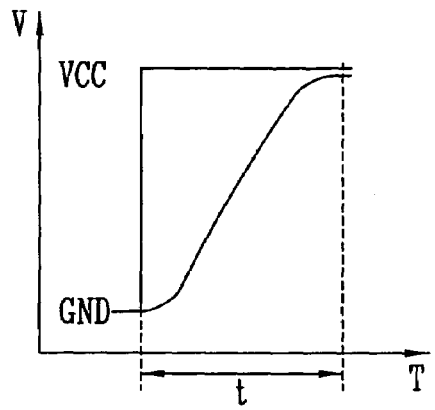
FIG. 7 shows a waveform of a bias voltage applied to the DSL and SSL.

Further, a loading time t (see FIG. 7) during which the DSL and the SSL are charged up with a bias applied to the DSL and SSL can be expressed into the following Equation (B).

$$t = R \times C \tag{B}$$

In Equation (B), R indicates a total resistance of gate lines of the DSL and SSL and C indicates a total capacitance of the DSL and SSL and neighboring lines. The shorter the loading time, the better. As can be seen from Equation (B), the loading time t is decided by the total resistance of the DSL and SSL.

Meanwhile, in the disclosed NAND flash memory device, the butting taps Bt4 are also formed at the ends of the DSL and SSL on the opposite side of the X-decoder 120. This will be described with reference to FIGS. 5 and 6.

Figure 5:
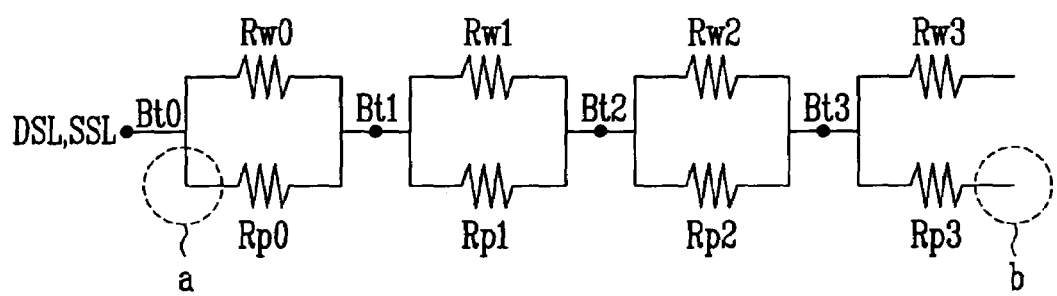
FIG. 5 is a circuit diagram for explaining the DSL and the SSL as shown in FIG. 3.
Figure 6:
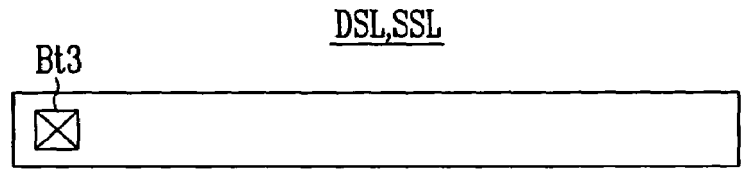
FIG. 6 is a plan view of the DSL and SSL as shown in FIG. 5.

As shown in FIGS. 5 and 6, when the butting taps Bt4 are not formed, a cell located at a portion 'b' has a resistor Rp3 of only the first poly layer 103 in the last butting tap Bt3. This becomes disadvantageous in terms of loading. This leads to lots of problems when the loading time is bad and gives rise to lots of problems in the operational uniformity. Furthermore, as the NAND flash memory device is highly integrated, the gate length of the DSL and SSL becomes gradually small and a total resistance abruptly increases. Also, a space with neighboring word lines WL0 to WL15 becomes narrow and a high dielectric material such as a nitride film is used. Thus, there are problems in that the whole capacitance increases and the loading time increases as a whole. Accordingly, it becomes difficult to process the DSL and the SSL with the ground voltage and at a proper timing.

If a bias is inputted due to a difference in loading at the locations 'a' and 'b' shown in FIG. 5, there is a difference in voltage clamping. This is a value resulting from RC delay. The location 'a' can be clamped without RC delay since it is adjacent to the bias input terminal. In the case of the location 'b', however, clamping is delayed due to RC delay since the location is far from the bias input terminal. If timings of the bit lines Ble and Blo are inconsistent, the leakage current occurs, and it becomes a factor in generating a time delay, etc. even in the operation of a chip.

Figure 9:
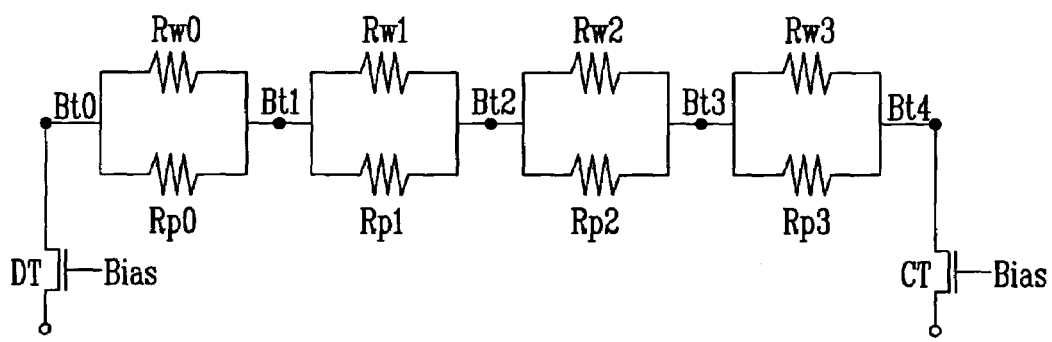
FIG. 9 is an equivalent circuit diagram of another NAND flash memory device according to another disclosed embodiment.
Figure 12:
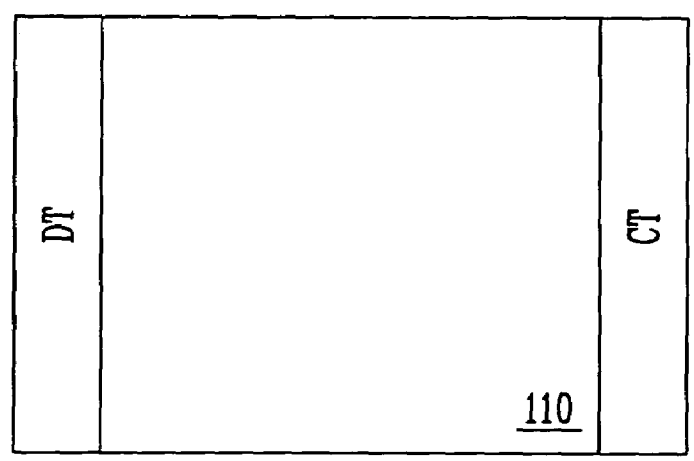
FIG. 12 is a conceptual view of the NAND flash memory device shown in FIG. 9.
Figure 13:
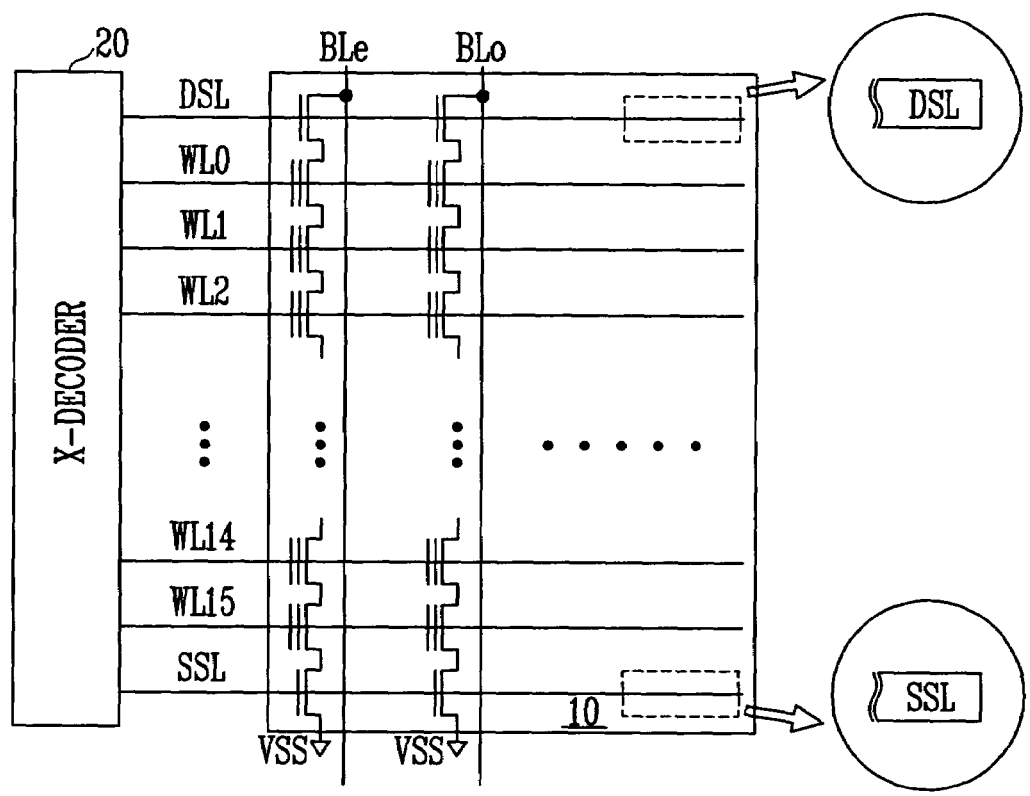
FIG. 13 is a circuit diagram showing the construction of a prior art NAND flash memory device.

Further, in the disclosed NAND flash memory device, the transistors DT and CT are connected to the X-decoder 120 and the butting taps Bt0 and Bt4 on the opposite side of the X-decoder 120, respectively, as shown in FIG. 9 and FIG. 12. To the X-decoder 120 is typically connected the decoding transistor DT, so that a bias voltage is applied to the DSL and SSL through the decoding transistor DT. In the preferred embodiment, as described above, the clamping transistor CT as well as the decoding transistor DT are connected to the butting tap Bt4 on the opposite side of the X-decoder 120. Of course, the bias voltage is applied to the DSL and SSL through the clamping transistor CT in the same manner as the decoding transistor DT. It is thus possible to reduce the loading time to ¼.

Figure 10:
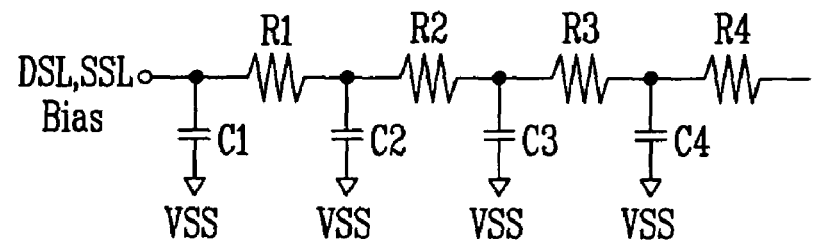
FIGS. 10 and 11 are circuit diagrams of the DSL and the SSL as shown in FIG. 3.
Figure 11:
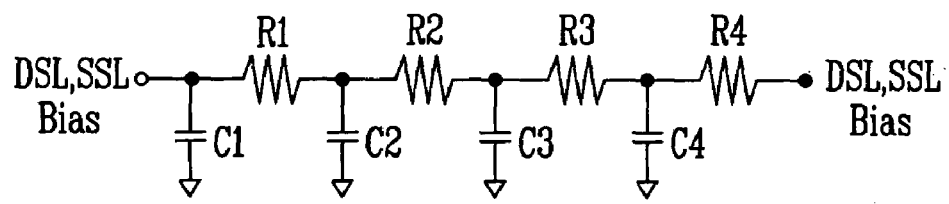

Meanwhile, FIGS. 10 and 11 show loading circuits of the DSL and the SSL when R=(Rw×Rp)/(Rw+Rp) where capacitance is Ci. In this case, R=R1=R2=R3=R4. Also, in Ci, 'i' is 1 to 4 and C1=C2=C3=C4. In the event that a bias is applied to one side of the equivalent circuit shown in FIG. 10, a loading time t1 in this case can be expressed into the following Equation (C). In the case where the bias is applied to both sides of the equivalent circuit shown in FIG. 10, a loading time t2 in this case can be expressed into the following Equation (D).

$$t1 = 0.38 \times 4R \times 4C \tag{C}$$

$$t2 = 0.38 \times 2R \times 2C \tag{D}$$

In Equation (C) and Equation (D), '0.38' is a constant.

As can be seen from Equation (C) and (D), if a bias is applied to both ends of the DSL and SSL, the loading time can be reduced during precharging and discharge.

As described above, according to the present invention, the butting taps are formed in such a manner that a poly layer and a silicide layer are connected to given points including the ends of DSL and SSL of a NAND flash memory device through metal contacts. Therefore, the resistance of the DSL and the SSL can be reduced and loading times of the DSL and the SSL can be thus reduced.

Although the foregoing description has been made with reference to the preferred embodiments, it is to be understood that changes and modifications may be made by the ordinary skilled in the art without departing from the spirit and scope of the appended claims.

What is claimed is:

1. A NAND flash memory device comprising a plurality of memory cells serially connected to form one string,
   the NAND flash memory device further comprising a memory cell array comprising a plurality of the strings,
   a drain select line and a source select line for transferring a bias received from a X-decoder to the opposite side of the X-decoder in order to select the strings;
   first and second butting taps formed on the drain select line and the source select line in which the first and second butting taps are positioned at the end of the drain select line and the source select line neighboring the X-decoder, respectively, and a bias is applied to the drain select line and the source select line through a first transistor; and
   third and fourth butting taps formed on the drain select line and the source select line in which the third and fourth butting taps are positioned at the end of the drain select line and the source select line on the opposite side of the X-decoder, respectively, and the bias is applied to the drain select line and the source select line through a second transistor.

2. The NAND flash memory device as claimed in claim 1, wherein the butting taps are formed every 512 memory cells.

3. The NAND flash memory device as claimed in claim 1, wherein each butting tap comprises a poly layer and a silicide layer that constitutes the drain select line and the source select line are electrically interconnected through metal contacts.

4. The NAND flash memory device as claimed in claim 1, wherein the first transistor connected to the first and second butting taps is a decoding transistor; and
   wherein the second transistor connected to the third and fourth butting taps is a clamping transistor.

\* \* \* \* \*